United States Patent [19]

Fridman

[11] Patent Number: 4,605,152

[45] Date of Patent: Aug. 12, 1986

[54] DEVICE FOR ATTACHING MODULAR ELECTRONIC COMPONENTS TO OR REMOVING THEM FROM AN INSULATIVE SUBSTRATE

[75] Inventor: Robert Fridman, Randallstown, Md.

[73] Assignee: Pace, Incorporated, Laurel, Md.

[21] Appl. No.: 583,218

[22] Filed: Feb. 24, 1984

[51] Int. Cl.⁴ .................. B23K 1/12; B23K 31/02
[52] U.S. Cl. ........................ 228/6.2; 228/20; 228/180.2; 219/373
[58] Field of Search .............. 228/20, 242, 240, 264, 228/6.2, 180.2; 219/373

[56] References Cited

U.S. PATENT DOCUMENTS 3,524,247 8/1970 Goldschmied .................. 228/242
3,702,692 11/1972 Metzger et al. ................. 228/242
4,295,596 10/1981 Doten et al. .................... 228/264

Primary Examiner—Nicholas P. Godici
Assistant Examiner—Samuel M. Heinrich
Attorney, Agent, or Firm—Gerald J. Ferguson, Jr.; James B. Bryan; Michael P. Hoffman

[57] ABSTRACT

A device is disclosed for attaching to or removing modular electronic components from a substrate which is adjustably positioned beneath a heater means delivering a flow of uniformly heated air. The heated air is directed to the sides of the component to melt solder associated with terminals thereon by a series of changable nozzles which can be moved into or out of registry with the component. Vacuum means is also provided for contacting the component to position it on or remove it from the substrate.

10 Claims, 10 Drawing Figures

DEVICE FOR ATTACHING MODULAR ELECTRONIC COMPONENTS TO OR REMOVING THEM FROM AN INSULATIVE SUBSTRATE

BACKGROUND OF THE INVENTION

This invention relates to heating devices and more particularly to a device for attaching modular electronic components to or removing them from a substrate such as a printed circuit board.

Present day devices for removing or installing modular electronic components from a substrate such as a printed circuit board generally fall into two categories: those which use a heated head which contacts each terminal to melt the solder thereon or those which use a blast of hot air to melt the solder. The former devices are generally very complex and employ a heated head having a plurality of spaced apart fingers each of which must be precisely aligned with each terminal around the component to simultaneously heat the solder on it. The component is then withdrawn from the substrate by vacuum suction or other mechanical means. The procedure is reversed for installing a component. An example of such a device is disclosed in U.S. Pat. No. 3,382,564. A major disadvantage of this type of device is that, due to the ever-increasing miniaturization of electronic systems and individual components in them, the terminals of such components are extremely close together thus making precise alignment of the fingers of the heating head therewith extremely difficult. Improper alignment or contact often results in solder flowing between terminals on the component thus shorting them or otherwise damaging them. The latter devices direct a blast of hot air at the terminals from a source above the component to simultaneously melt the solder on each. Such a device, for example, is set forth in U.S. Pat. No. 4,366,925. Such a device may function satisfactorily if there is a large spacing between components such that the blast of hot air directed at one component from above will not spill over and melt the solder on the terminals of adjacent components. However, as aforementioned, not only are the components themselves becoming increasingly smaller but their proximity on the printed circuit substrate is also increasing. Thus, there is a need for a device which not only can provide a closely controlled and evenly distributed source of heat sufficient to melt solder associated with component terminals or printed substrate conductors during installation or removal of the electronic component relative thereto but one which also can rapidly and precisely direct this controlled heat where desired thereby minimizing the likelihood of melting the solder on the terminals of adjacent components or otherwise damaging the printed conductors on the substrate. There is also a need for a device of the subject type which has the capability of precisely positioning the electronic component and its terminals on the ends of the printed conductors on the substrate to insure no overlapping as well as removing the component to insure that no liquid solder is smeared on the substrate between the conductors printed thereon.

It is therefore the primary object of the present invention to provide a superior device for installation and removal of electronic components from circuits printed on a substrate.

It is another object of the present invention to provide a device of the subject type which employs a series of stacked nozzles for precisely directing the flow of hot air from a source simultaneously to the solder associated with each component terminal or printed conductor on the substrate.

It is yet another object of the present invention to provide a device wherein the aforementioned nozzles can be both rapidly changed to correspond to the different size of various electronic components as well as moved separately or together to a location to permit cleaning or other preparation of the substrate without shutting off the source of heated air.

It is a further object of the present invention to provide a device which has means for rapidly and accurately positioning the substrate and the electronic component to be installed or removed beneath the source of heated air.

It is a still further object of the present invention to provide a device which has a vacuum means axially aligned with the source of heated air and directing nozzles for positioning the electronic component on or removing it from the substrate.

BRIEF DESCRIPTION OF THE DRAWING

Other objects, details and advantages of the invention will be more readily apparent in the light of the explanation which follows of a preferred embodiment of a device according to the invention, given only by way of example and with references to the accompanying drawing in which.

DESCRIPTION OF PREFERRED EMBODIMENT

Figure 1:
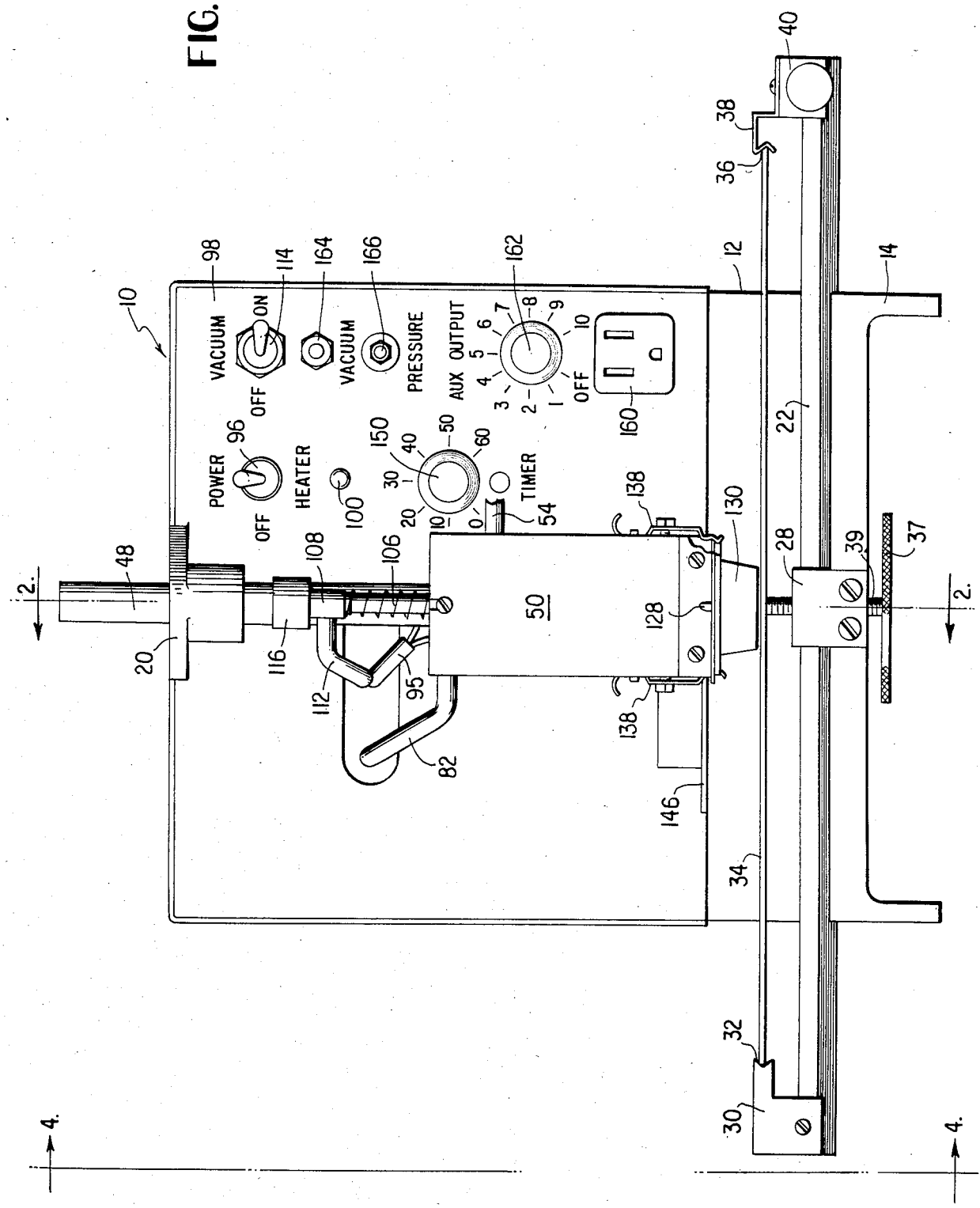
FIG. 1 is a front elevational view of the device of the subject invention.

Referring now to the drawings where like characters of reference refer to similar elements in each of the several views, numeral 10 indicates generally the device of the present invention for attaching modular electronic components to or removing them from an insulative substrate.

More specifically, referring to FIGS. 1-4, the device 10 comprises a main frame element 12 having a base section 14, a mounting section 16 parallel to the base section 14, a vertical section 18 and a top mounting arm 20 extending from the vertical section 18 parallel to the base section 14. A rectangular shaped rod 22 is slidably mounted between a groove 24 in the base section 14 and a groove 26 in a clamp 28 secured to the base 14. A fixed block 30 is secured at one end of the rod 22 and has a V-shaped recess 32 formed therein for supporting an edge of a substrate or printed circuit board 34 as it is often called. The opposite edge of the substrate 34 is supported in a similar shaped recess 36 of a spring clip 38. The spring clip 38 in turn is secured to a block 40 which is slidable on the other end of the rod 22. A knob 37 having a shaft 39 in threaded engagement with base section 14 is provided which can be rotated into engagement with the underside of the substrate 34 to support the middle of same. The substrate 34 generally has a plurality of electronic components 42 positioned thereon which have connection terminals 44 extending around the periphery thereof (see FIG. 9). The terminals 44 are soldered to conductors 46 of an interconnection network on the top surface as well as between various layers of the substrate which is typically made of an insulative, ceramic material. The electronic component 42 can thus be positioned in one direction by moving the substrate 34 in recesses 32, 36 and in a direction ninety-degrees relative to that direction by sliding the rod 22 in the grooves 24, 26. A shaft 48 is secured at one of its ends to the top mounting arm 20 and extends downward toward the base section 14.

Figure 5:
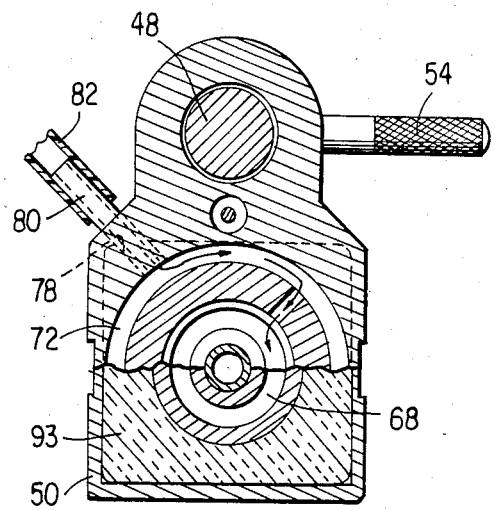
FIG. 5 is a cross-sectional view of the heater assembly taken along the lines 5—5 of FIG. 2.
Figure 6:
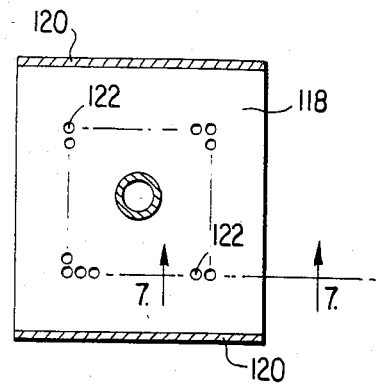
FIG. 6 is a view in partial cross-section of a nozzle taken along the lines 6—6 of FIG. 2.
Figure 7:
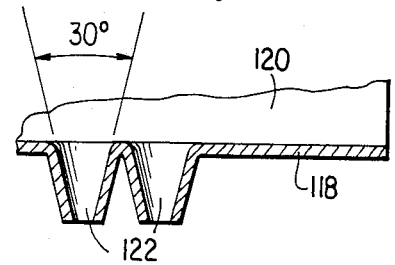
FIG. 7 is an enlarged cross-sectional view taken along the lines 7—7 of FIG. 6.
Figure 8:
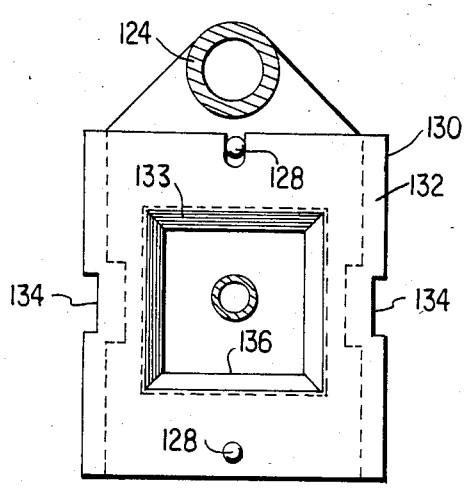
FIG. 8 is a view of the locator nozzle taken along the lines 8—8 of FIG. 2.

An assembly 50 for heating the solder associated with the terminals 44 and conductor 46 of the electronic component 42 and lifting it from the substrate 34 is mounted for vertical as well as horizontal movement on the shaft 48. The assembly 50 comprises a mounting block 52 which is journaled on the shaft 48 and can be rotated as described below under "OPERATION", or raised and lowered by means of handle 54. The mounting block 52 has a cylindrical shaped cavity 56 formed therein and an inward, radially extending lip 58 which terminates at passageway 60 that connects an upper chamber 62 with a lower chamber 64. A heating element 66 of the electrical resistance type is positioned in the upper chamber 62 on the lip 58. The heating element 66 is cylindrical in shape and has a plurality of through-passages 68 extending the length thereof for heating a fluid such as air passing through as will be more fully described later. Although air is mentioned herein as the fluid to be heated, it is to be understood that various types of gases, be they inert or not, are also contemplated to be used. A plug 70 is provided in the mounting block 52 to 62. The plug 70 has a enclose the end of the upper chamber circumferential recess 72 from which inlet ports 74 extend inwardly to an opening 76. A base 78 through the mounting block 52 communicates at one end with the recess 72 and is connected at the other end to a tube 80 as can best be seen in FIG. 5. Air under pressure is delivered to the tube 80 by hose 82 from a source 84 which consists of a pneumatic pump secured to the mounting section 16 and enclosed by housing 85. The pump 84 has a pressure side 86 and a vacuum side 88 with filters 90. The electric motor (not shown) of the pump 84 has one end 92 of its shaft exposed. A flexible drive shaft (also not shown) can be connected to shaft 92 to power small hand-held drills, wire wheels and the like to perform minor repair and cleaning operations on the substrate 34. The remainder of the upper chamber 62 is filled with an insulating material 93 to prevent dissipation of heat from the heating element 66 and maximize heating of the air traveling in through passages 68. A heat sensing element 94 in the form of a thermistor is located in the lower chamber 64 to sense the temperature of the air passing therethrough to thereby control the energization of the heating element 66 to maintain it at a preselected level. Energization of the heating element circuit (not shown) is controlled by switch 96 located on control panel 98. A light 100 is also provided to indicate when the heating element 66 is in operation. Wires from the thermistor 94 and heating element 66 are carried in flexible conduit 95.

Figure 2:
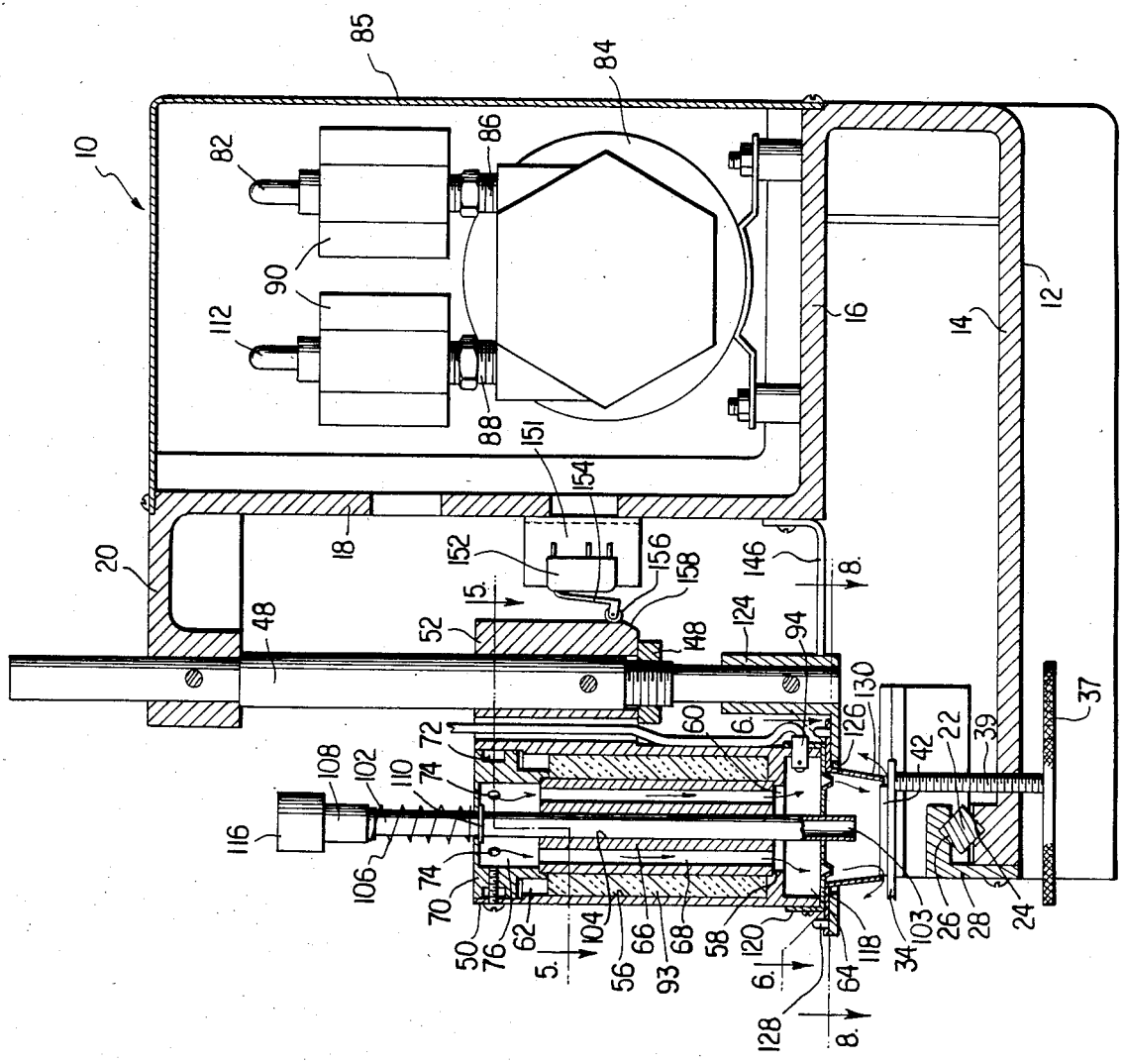
FIG. 2 is a side elevational view in partial cross-section taken along the lines 2—2 of FIG. 1.
Figure 3:
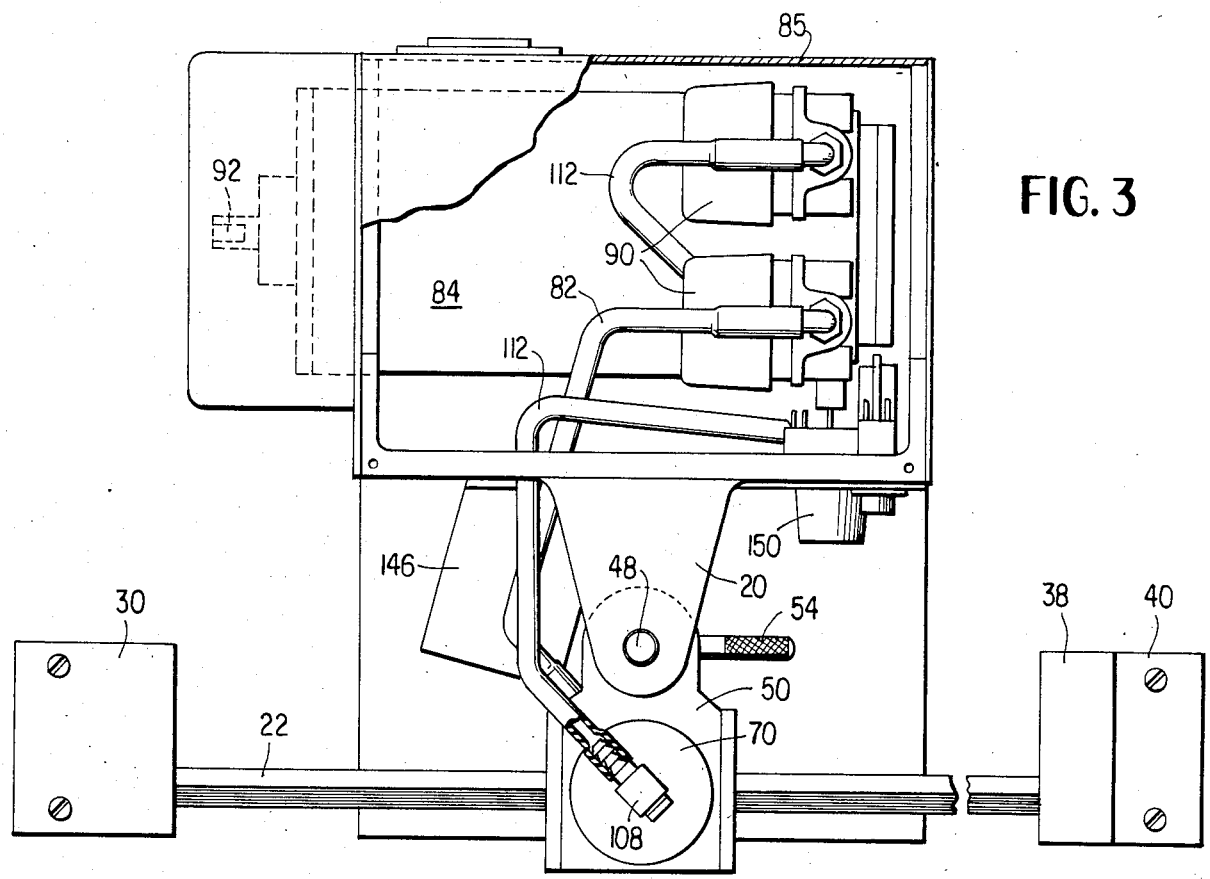
FIG. 3 is a plan view of the device shown in FIG. 1.
Figure 4:
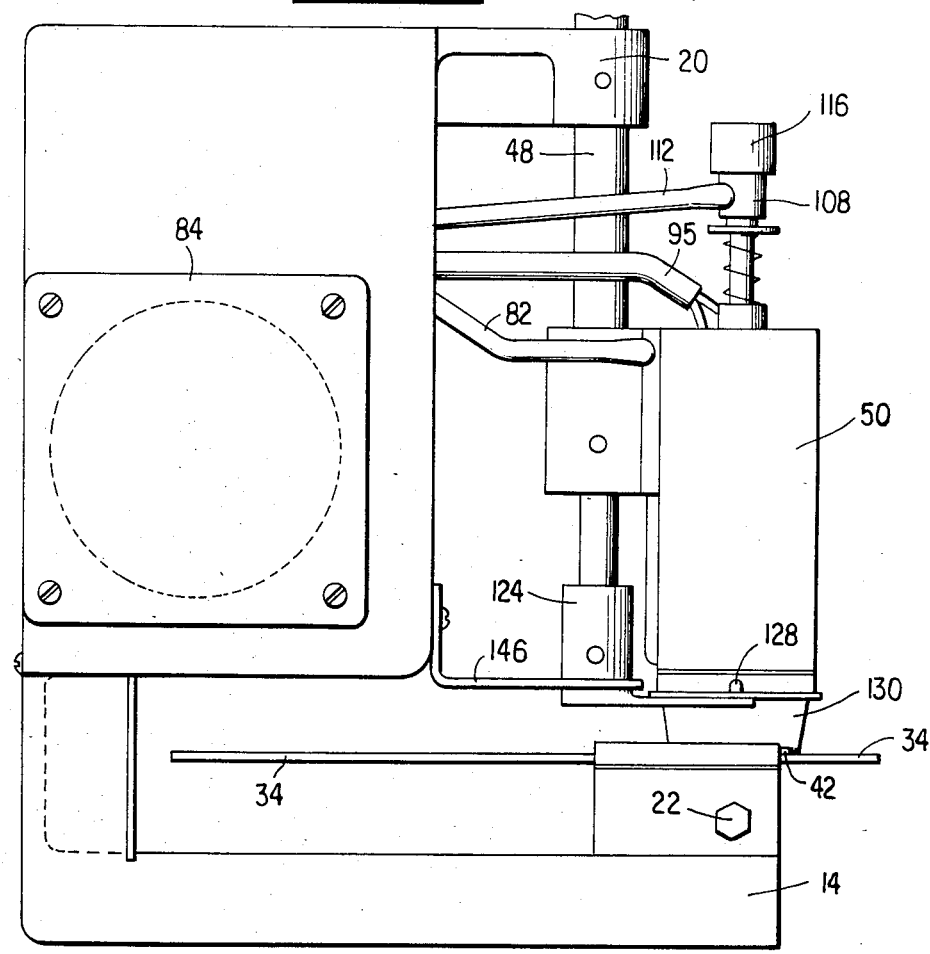
FIG. 4 is a side elevational view taken along lines 4—4 of FIG. 1.

An elongated vacuum tube 102 is slidably mounted in the plug 70 and extends through a bore 104 in the heating element 66, through the lower chamber 64 to a first position shown in FIG. 2. The vacuum tube is maintained in this first position by means of a compression spring 106 acting between the plug 70 and fitting 108 on the upper end thereof. A retainer ring 110 is provided to limit upward travel of the vacuum tube 102. The vacuum tube 102 is also connected by a hose 112 secured at one end to the fitting 108 and the other end to the vacuum side 88 of the pump 84 by way of a vacuum control valve 114 located on the panel 98. Actuation of the vacuum control valve 114 by pressing on button 116 causes a vacuum to be created in the vacuum tube 102 and at the end 103 thereof for removing an electronic component 42 as will be more fully described later.

Referring now to FIGS. 2, 6, 7 and 8, a nozzle plate 118 is secured by side flanges 120 to the opening in the mounting block 52 adjacent the lower chamber 64. The nozzle plate 118 has a plurality of nozzle orifices 122 formed therethrough which have sides tapered at an angle of approximately 30 degrees with respect to each other. The orifices 122 are arranged in a rectangular shape which generally corresponds to the shape of the outer perimeter of the electronic component 42. A holder 124 is also mounted on the shaft 48 and it is capable of vertical as well as horizontal (rotational) movement as is the block 52. The holder 124 has a rectangular shaped opening 126 adjacent to which are two oppositely disposed guide pins 128. A locator nozzle 130 has a base 132 and a flanged portion 133 which is inserted in the opening 126 and retained by guide pins 128. The base 132 has notches 134 the function of which will be described shortly. The flanged portion 133 has an opening 136 which is the same shape but is slightly larger than the perimeter of the electronic component 42. With the assembly 50 raised and rotated out of the way, the electronic component 42 can be viewed through the opening 136 from above and positioned so that it is equidistant or centered within the opening 136.

Figure 9:
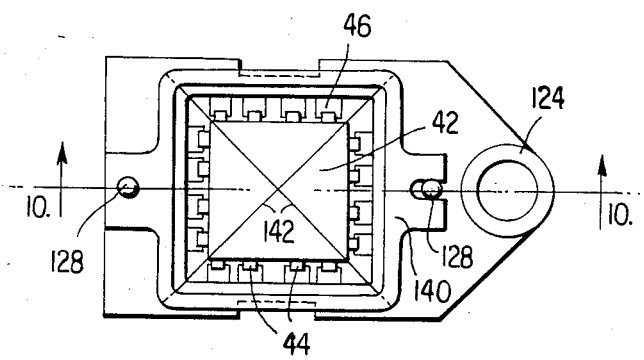
FIG. 9 is a plan view of the holder assembly with a chip located in position.
Figure 10:
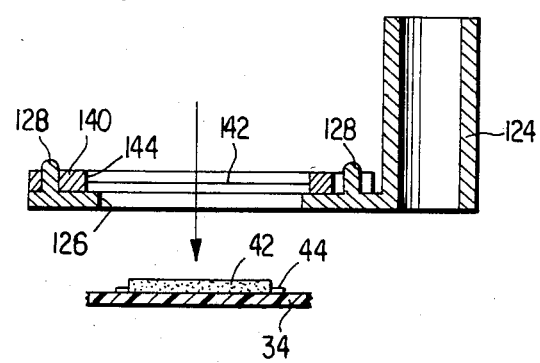
FIG. 10 is a cross-sectional view taken along the lines 10—10 of FIG. 9.

The locator nozzle 130 can be attached to the assembly 50 and rotated out of the way therewith by means of clips 138 which engage the notches 134 as best seen in the cut away view shown in FIG. 1. With the locator nozzle 130 rotated out of the way, an aligning plate 140 can be installed on the guide pins 128 as shown in FIGS. 9 and 10. The aligning plate 140 has wires 142 crossed at 90 degrees with respect to each other and secured in the corners of the opening 144. Thus, when the corners of the electronic component 42 are each beneath one of the wires 142, the component is precisely centered in the opening 144. After the electronic component 142 is centered, the plate 140 is removed and the assembly 50 together with locator nozzle 130 is returned for removal or installation of the component as will be fully described with the explanation of the operation of the device. A platform 146 is secured to the vertical section 18 and extends outwardly therefrom. The platform 146 acts to shield the substrate 34 and electronic components 42 thereon from the heated air emmanating from opening 136 when the assembly 50 is in the rotated position. In order to accurately position the opening 136 of the locator nozzle 130 a predetermined distance above the substrate 34, a nut 148 is provided threaded on the shaft 48 which can be raised and lowered by rotation to thereby limit downward travel of the mounting block 52 and locator nozzle clipped thereto.

A timer 150 is located on the panel 98 which can be set to provide an audible alarm when the set time limit has expired. The operation of the timer is started by closure of a microswitch 152 mounted by a bracket 153 having an actuating arm 154 and roller 156 thereon. A cam surface 158 on the mounting block 52 is engaged by the roller 156 to operate the switch 152 when the assembly 50 is lowered into operating position.

An electrical outlet 160 is also provided on the panel 98 into which can be plugged various auxiliary devices such as a hand held desoldering and vacuum solder removing device (not shown) for cleaning and repair work.

The degree of energization of the device 160 and thus its temperature can be adjusted by controller 162. A source of vacuum 164 is also located on the panel 98 as is a source of air under pressure 166 for blowing debris from the substrate 34 to assist in cleaning it.

OPERATION

Energization of the heater element 66 by actuation of switch 96 also starts pump 84 to provide both a source of air under pressure as well as a source of vacuum. With the vacuum in tube 102 shut off by control valve 114, a locator nozzle 130 is selected having an opening 136 slightly larger than the perimeter of the electronic component to be installed or removed and this is clipped onto the mounting block 52. The entire assembly 50 and locator nozzle 130 are then rotated and lowered to a position where the platform 146 covers the opening 136 to thereby prevent hot gasses from damaging the substrate 34.

If the electronic component 42 is to be removed from the substrate 34, the aligning plate 140 is positioned on the holder 124 and the component is aligned beneath the crosswires 142 by sliding the substrate in the grooves 32, 36 and positioning it by moving rod 22. After the electronic component 42 is aligned, the aligning plate 140 is removed and the assembly 50 rotated such that the locator nozzle 130 is above the opening 126 in the holder 124. A time sufficient to insure proper melting of the connecting solder is selected on timer 150 and the assembly 50 and locator nozzle 130 are lowered to a position above the terminals 44 on the electronic component 42 as preselected by the location of nut 148. At this location, the opening 136 of the locator nozzle 130 is spaced apart a short distance from the substrate 34 which is just sufficient to permit the heated air to escape out. Lowering of the assembly 50 caused energization of the timer by switch 152. During this period, air under pressure from the pump 84 flows through the bore 78 into recess 72 and from there through inlet ports 74 into opening 76 above the heating element 66. As the air flows downward (see arrows) in through passages 68 it is heated to a preselected solder melting temperature. The air thus heated exits through passages 68 into the lower chamber 64 and from there through nozzle orifices 122 where it is converted into a plurality of jet streams. These jet streams are then guided by the wall of locator nozzle 130 to the opening thereof 136. As the heated air exits the opening 136 it heats the solder between the terminals 44 and conductors 46 thus melting the solder and freeing electronic component 42 which should coincide with expiration of the time on the timer 150 as indicated, for example, by an audible signal. At this time, the vacuum control valve 114 is acutated causing a vacuum in tube 102 and at the end 103 thereof. Manual downward pressure on the button 116 causes the end 103 to engage the electronic component 42 which will then adhere to the end 103 as the tube returns to its rest position. The assembly 50 and locator nozzle 130 are then raised, rotated and lowered onto platform 146. The holder 124 can also be rotated with the assembly 50 at this time to clear the area above the site.

After the site has been cleaned and prepared by the auxiliary equipment aforementioned, a new electronic component can be positioned on the conductors 46 by the aligning plate 140 on holder 124 and soldered thereto by again lowering the assembly 50 and locator nozzle 130 adjacent thereto for a timed period.

Applicant has thus disclosed his novel device for rapidly and accurately removing electronic components from or installing them on a substrate. However, it is not intended to limit the invention to the embodiment of the device which has just been described and it is intended by the appended claims to include all technically equivalent means which come within the full scope and true spirit of the invention.

I claim:

1. A device for attaching modular electronic components to or removing them from a substrate, said device comprising:
   (a) a frame having a support shaft secured at one end to said frame,
   (b) heater means slidably mounted on said support shaft intermediate the ends thereof for heating a flow of air from a source, said heater means having a first nozzle means secured to one end thereof for directing said heated air flow,
   (c) means for adjustably positioning said substrate containing said modular electronic component beneath said heater means, and
   (d) holder means slidably mounted on the other end of said shaft, said holder means having a second nozzle means removably mounted thereon which is adapted to substantially enclose said modular electronic component and direct said heated air flow from said first nozzle means adjacent the sides of said component to melt solder associated therewith.

2. The device as set forth in claim 1 further comprising vacuum means mounted for reciprocal movement within said heater means for contacting said modular electronic component and removing same.

3. The device as set forth in claim 1 wherein said heater means comprises a substantially cylindrical shaped heater element and said air from said air source flows around said heater element and is heated thereby.

4. The device as set forth in claim 1 wherein said first nozzle means comprises plate means having a plurality of side-by-side nozzle openings formed therethrough which direct said heated air flow downward into said second nozzle means.

5. The device as set forth in claim 1 wherein said second nozzle means comprises an enclosure having side walls which taper from an upper opening adapted to receive said heated air flow to a lower opening whose shape is slightly larger than the periphery of said modular electronic component.

6. The device as set forth in claim 1 wherein said device further comprises shield means mounted on said frame above said substrate and said heater means can be moved from a position above said second nozzle means to a position above said shield means to thereby prevent said heated air from reaching said substrate during placement of said second nozzle means.

7. The device as set forth in claim 1 further comprising guide means adapted to be positioned on said holder means to facilitate the alignment of said modular electronic component directly beneath said second nozzle means.

8. The device as set forth in claim 1 wherein said means for adjustably positioning said substrate comprises:
   (a) rod means slidably mounted in said frame, said rod means having bracket means on the ends thereof for supporting said substrate therebetween, at least one of said bracket means being adjustable on said rod means.

9. A device for attaching modular electronic components to or removing them from a substrate where each said component has a plurality of terminals extending from the periphery thereof, said device comprising:

heater means having at least one passage extending therethrough for heating a fluid flowing through said passage;

first nozzle means disposed at one end of the heater means, said first nozzle means including a plate having a plurality of nozzle openings where the configuration of the plurality of openings generally corresponds to that of the plurality of terminals of the component and where the heated fluid from the heater means flows through the nozzle openings; and second nozzle means disposed adjacent said first nozzle means for directing the heated fluid flowing through the nozzle openings to the terminals of the component, said second nozzle means having side walls defining a lower opening positionable adjacent said electronic component, said lower opening being larger than the periphery of said electronic component, said second nozzle means being separated from said substrate by a gap whereby heated fluid flows out of said gap after it has melted said solder.

10. A device according to claim 9, wherein said second nozzle means includes an enclosure having side walls which taper inwardly from an upper opening disposed adjacent to said plate to said lower opening.

* * * * *